United States Patent
Ren et al.

(10) Patent No.: US 11,206,040 B2
(45) Date of Patent: Dec. 21, 2021

(54) SERIAL INTERFACE FOR OVERSAMPLED AND NON-OVERSAMPLED ADCS

(71) Applicant: Analog Devices International Unlimited Company, Limerick (IE)

(72) Inventors: Naiqian Ren, Limerick (IE); Mary McCarthy, Innishannon (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/867,094

(22) Filed: May 5, 2020

(65) Prior Publication Data

US 2021/0351784 A1 Nov. 11, 2021

(51) Int. Cl.
   *H03M 1/66* (2006.01)
   *H03M 3/00* (2006.01)
   *H03M 1/46* (2006.01)

(52) U.S. Cl.
   CPC .......... *H03M 3/498* (2013.01); *H03M 1/462* (2013.01); *H03M 3/422* (2013.01)

(58) Field of Classification Search
   CPC .......... H03M 1/12; H03M 3/30; H03M 3/498; H03M 3/462; H03M 1/00; H03M 1/1225; H03M 1/1245; H03M 1/125; H03M 3/342; H03M 1/462; H03M 1/468; H03M 1/183; H03M 1/466
   USPC .................. 341/61, 143, 155, 166
   See application file for complete search history.

(56) References Cited

U.S. PATENT DOCUMENTS

| | | | | |
|---|---|---|---|---|
| 6,091,349 A * | 7/2000 | Chadha | ................. | H03M 3/368 341/118 |
| 6,147,631 A * | 11/2000 | Maulik | ................... | H03M 3/35 341/122 |
| 6,417,792 B1 * | 7/2002 | King | .................... | G01R 21/133 341/143 |
| 7,190,197 B1 * | 3/2007 | You | ....................... | G11C 27/02 327/141 |
| 8,086,761 B2 | 12/2011 | Huang et al. | | |
| 8,742,968 B2 | 6/2014 | Quiquempoix | | |
| 10,320,407 B1 | 6/2019 | Kamath et al. | | |
| 2002/0126032 A1 * | 9/2002 | Nanda | .................. | H03M 3/392 341/155 |

(Continued)

OTHER PUBLICATIONS

"AD4111: Single Supply, 24-Bit, Sigma-Delta ADC with Plus or Minus 10 V and 0 mA to 20 mA Inputs, Open Wire Detection", Analog Devices Data Sheet, (2018), 59 pgs. (Year: 2018).*

(Continued)

*Primary Examiner* — Linh V Nguyen
(74) *Attorney, Agent, or Firm* — Schwegman Lundberg & Woessner, P.A.

(57) ABSTRACT

An apparatus comprises a sigma-delta analog-to-digital converter (ADC) circuit including a serial data input, a serial data output, a serial clock input to receive a serial clock signal, and a master clock input to receive a master clock signal; a digital isolator circuit including outputs coupled to the serial clock input and serial data input of the sigma-delta ADC circuit, and an input coupled to the serial data output of the sigma-delta ADC circuit; an oscillator circuit unconnected to the digital isolator circuit and configured to generate the master clock signal asynchronous to the serial clock input signal; and wherein the sigma-delta ADC circuit generates an ADC sampling clock using the master clock.

21 Claims, 9 Drawing Sheets

(56) References Cited

U.S. PATENT DOCUMENTS

| | | | | |
|---|---|---|---|---|
| 2006/0125661 | A1* | 6/2006 | Nanda | G06F 1/22 341/50 |
| 2008/0074303 | A1* | 3/2008 | Rueger | H03M 3/39 341/143 |
| 2011/0080925 | A1* | 4/2011 | Molina | H03M 1/0872 370/538 |
| 2013/0120032 | A1* | 5/2013 | Quiquempoix | G06F 13/4282 327/142 |
| 2014/0266373 | A1* | 9/2014 | Goswami | H03K 3/011 327/262 |
| 2015/0332785 | A1* | 11/2015 | Steensgaard-Madsen | H03M 5/02 341/122 |
| 2018/0191334 | A1* | 7/2018 | Sadasivam | H04L 25/0266 |

OTHER PUBLICATIONS

U.S. Appl. No. 13/453,401, filed Apr. 23, 2012, Getzin, Lawrence, et al.

"AD4110-1: Universal Input Analog Front End with 24-Bit ADC for Industrial Process Control Systems", Analog Devices Data Sheet, (2019), 74 pgs.

"AD4111: Single Supply, 24-Bit, Sigma-Delta ADC with Plus or Minus 10 V and 0 mA to 20 mA Inputs, Open Wire Detection", Analog Devices Data Sheet, (2018), 59 pgs.

"AD4112: Single Supply, 24-Bit, Sigma-Delta ADC with Pius or Minus 10 V and 0 mA to 20 mA Inputs", Analog Devices Data Sheet, (2019), 58 pgs.

"AD7124-4: 4-Channel, Low Noise, Low Power, 24-Bit, Sigma-Delta ADC with PGA and Reference", Analog Devices Data Sheet, (2018), 93 pgs.

"AD7124-8: 8-Channel, Low Noise, Lovy Power, 24-Bit, Sigma-Delta ADC with PGA and Reference", Analog Devices Data Sheet, (2018), 94 pgs.

"AD7175-8: 24-Bit, 8-/16-Channel, 250 kSPS, Sigma-Delta ADC with True Rail-to-Rail Buffers", Analog Devices Data Sheet, (2015), 64 pgs.

"AD7768-1: DC to 204 kHz, Dynamic Signal Analysis, Precision 24-Bit ADC with Power Scaling", Analog Devices Data Sheet, (2018), 80 pgs.

"AD7788/AD7789: Low Power, 16-/24-Bit, Sigma-Delta ADCs", Analog Devices Data Sheet, (2016), 20 pgs.

"AD7791: Low Power, Buffered 24-Bit Sigma Delta ADC", Analog Devices Data Sheet, (2013), 20 pgs.

"AD7796/AD7797: Low Power, 16-/24-Bit Sigma-Delta ADC for Bridge Sensors Low Power, 16-/24-Bit", Analog Devices Data Sheet, (2006), 24 pgs.

"ADS122U04 24-Bit, 4-Channel, 2-kSPS, Delta-Sigma ADC With UART Interface", Texas Instruments Data Sheet, (2018), 75 pgs.

"ADS1282 High-Resolution Analog-To-Digital Converter", Texas Instruments Data Sheet, (2020), 54 pgs.

"MAX11200/MAX11210: 24-Bit, Single-Channel, Ultra-Low-Power, Delta-Sigma ADCs with GPIO", Maxim Integrated Data Sheet, (2014), 26 pgs.

"MAX11206/MAX11207: 20-Bit, Single-Channel, Ultra-Low-Power, Delta-Sigma ADCs with Programmable Gain and GPIO", Maxim Integrated Data Sheet, (2012), 27 pgs.

* cited by examiner

SERIAL INTERFACE FOR OVERSAMPLED AND NON-OVERSAMPLED ADCS

FIELD OF THE DISCLOSURE

This document relates to integrated circuits and in particular to analog-to-digital converter (ADC) circuits.

BACKGROUND

ADC circuits are used to quantify an analog signal as a digital quantity that can be used in signal processing. Sometimes it is desirable to isolate the ADC circuit from the digital portion of the electronic system to allow a large common mode voltage difference between the ADC measurement input and the digital backend, and to reduce noise in the ADC measurements. Digital isolators can be used to provide translation of the digital signals between isolated domains of the digital circuits and the ADC circuits. The number of input/output (I/O) lines used by the digital interface directly determines the channel count requirement of the digital isolator. However, the more channels that are needed by the digital isolator to transfer signals between domains increases the cost of digital isolator circuits. Also, digital isolators can add jitter to the signal used to operate the ADC circuits.

SUMMARY OF THE DISCLOSURE

This document relates generally to comparator circuits and more specifically to isolation techniques for ADC circuits that reduce noise attributed to sampling clock jitter when sampling input signals having higher frequencies. In some aspects, an apparatus for data acquisition includes a sigma-delta analog-to-digital converter (ADC) circuit including a serial data input, a serial data output, a serial clock input to receive a serial clock signal, and a master clock input to receive a master clock signal; a digital isolator circuit including outputs coupled to the serial clock input and serial data input of the sigma-delta ADC circuit, and an input coupled to the serial data output of the sigma-delta ADC circuit; an oscillator circuit unconnected to the digital isolator circuit and configured to generate the master clock signal asynchronous to the serial clock input signal; and wherein the sigma-delta ADC circuit generates an ADC sampling clock using the master clock.

In some aspects, a method of controlling operation of an ADC includes receiving a serial clock signal from a digital isolator; generating a master clock signal for the ADC, wherein the master clock signal is asynchronous to the serial clock signal and is generated independently of any signal provided by the digital isolator; generating an output data rate signal using the serial clock signal; generating an ADC sampling clock using the master clock signal and the output data rate signal; and providing conversion data from a serial data output of the ADC circuit to the digital isolator according to the ADC sampling clock.

In some aspects, an apparatus for data acquisition includes a successive approximation register analog-to-digital converter (SAR ADC) circuit including a serial data input, and a serial data output, and a serial clock input to receive a serial clock signal; a digital isolator circuit including outputs coupled to the serial data in input, the serial data output, and the serial clock input of the SAR ADC circuit; and wherein the SAR ADC further includes logic circuitry configured to generate a conversion start signal using the serial clock signal received from an output of the digital isolator circuit.

In some aspects, a method of controlling operation of a successive approximation register analog-to-digital converter (SAR ADC) circuit includes receiving a serial clock signal from an output of a digital isolator circuit at an input of the SAR ADC circuit; generating a conversion start signal using the serial clock signal; generating conversion data in response to the conversion start signal; and providing the conversion data from a serial data output of the SAR ADC circuit to the digital isolator circuit.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
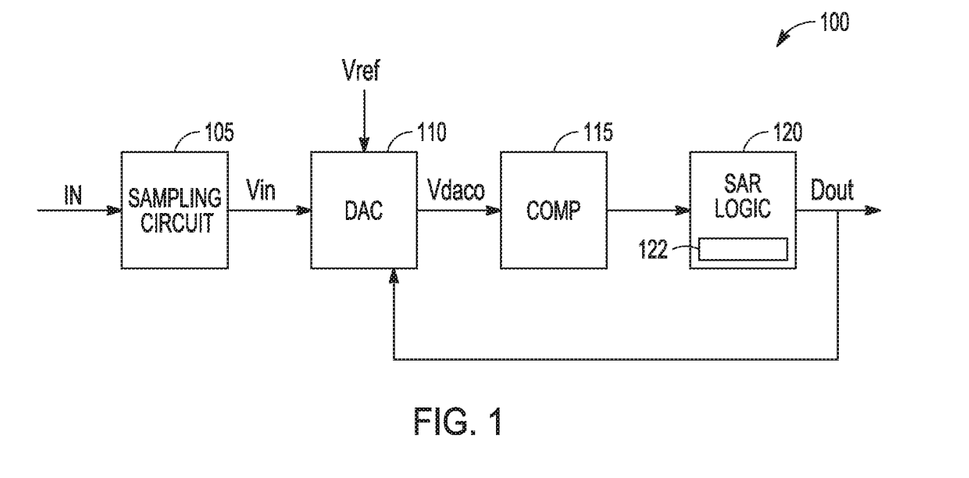
FIG. 1 is a block diagram of an example of a successive approximation register analog-to-digital converter (SAR ADC) circuit.

FIG. 1 is a block diagram of an example of a successive approximation register analog-to-digital converter (SAR ADC) circuit 101. The SAR ADC circuit includes a digital-to-analog converter (DAC) circuit 110, a sampling circuit 103 that may be included in the DAC circuit 110, a comparator circuit 115, and logic circuitry 120. The DAC circuit 110 includes weighted circuit components (e.g., capacitors). In certain examples, DAC circuit 110 is a sixteen bit DAC and includes sixteen capacitors. The sampling circuit 103 samples an input voltage at an input to the ADC circuit and holds a sampled voltage for comparison to the weighted circuit components. In certain examples, the DAC circuit 110 is a differential DAC circuit and a differential analog voltage is sampled and converted.

An output voltage of the DAC circuit 110 (Vdaco) is compared to the sampled and held voltage using comparator circuit 115. The bit values of the DAC circuit 110 are adjusted based on the output of the comparator circuit. The conversion may start with the DAC set to midscale. The comparator circuit 115 determines whether the DAC output is greater or less than the sampled input voltage and the result is stored as a one or zero for that bit of the DAC by connecting the capacitor to either $V_{REF}$ or GND. Conversion then proceeds to the next bit value until all bits of the digital value are determined. One iteration of changing the DAC output and comparing the voltage to the input voltage can be referred to as a bit trial.

The SAR logic circuitry 120 controls the ADC operation during the bit trials. The SAR logic circuitry 120 initiates one sample of the input voltage, initiates the first conversion of the sampled input voltage to a first set of bit values using the bit trials, and initiates a second conversion of the sampled input voltage to a second set of bit values. The logic circuitry can include a digital engine 122 to perform functions such as progressing the ADC through different states of operation and to perform the calculations described. The logic circuitry 120 determines the final M-bit digital value for the sampled input voltage and the final M-bit digital value is available at output Dout.

Figure 2:
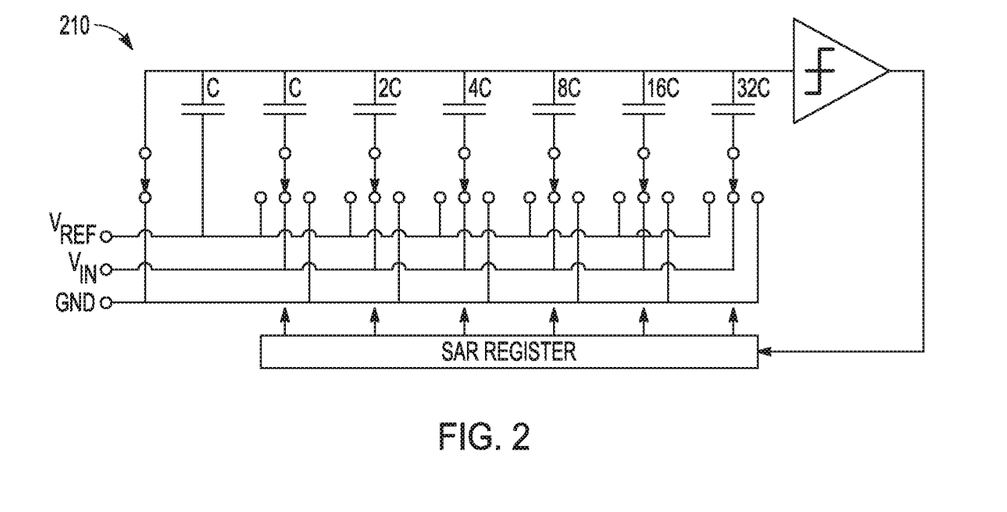
FIG. 2 is a block diagram of an example of a digital-to-analog converter (DAC) circuit.

FIG. 2 is a circuit diagram of portions of an example of a DAC circuit 210 for an eight bit SAR ADC. The DAC circuit 210 includes an array of weighted bit capacitors and includes an array of switch circuits that can be included in a sampling circuit, such as sampling circuit 104 of FIG. 1. The switches are configured by logic circuitry for a sampling phase, a conversion phase, and a reset phase of the DAC circuit. The DAC circuit in the example of FIG. 2 is shown in the sampling phase.

Figure 3:
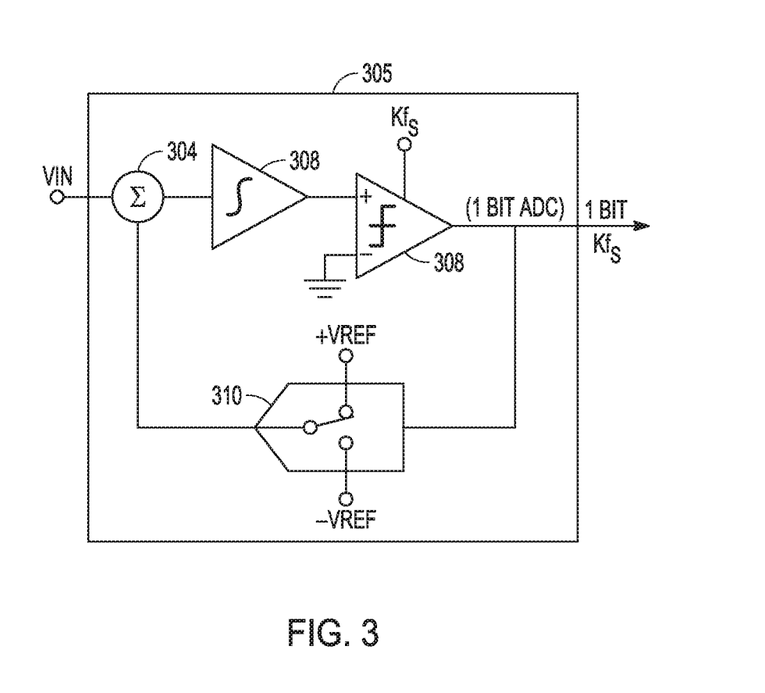
FIG. 3 is a block diagram of an example of a first order single bit sigma-delta analog-to-digital converter (sigma-delta ADC).

FIG. 3 is a block diagram of an example of a first order single bit sigma-delta ADC. The ADC 305 converts an input signal (u(t)) into a continuous serial stream of ones and zeros at a rate determined by a sampling clock frequency $Kf_s$. A quantizer can be used to quantize the analog input to a digital value. A one-bit digital to analog converter (DAC) 310 is driven by the serial output data stream to generate a feedback signal. The output of the DAC 310 is subtracted from the input signal using a summing element 304. Typically, the summing element 304 is implemented as the summing junction of an operational amplifier (op amp) such as the op amp of the integrator 306. The integrator 306 integrates the output of summing element 304, and the output of the integrator 306 is applied to a clocked latched comparator 308 to produce the one-bit ADC at the output.

For either an SAR ADC or a sigma-delta ADC, when the ADC is used in an isolated data acquisition (DAQ) system, there are digital signals that are transmitted and received across digital isolation. Digital isolators are used to provide translation of the digital signals between different power domains or between two domains having a different common mode. Some examples of digital isolator circuits can include optocouplers or transformers to provide the translation while providing isolation.

Using digital isolators can involve challenges. The number of channels across the digital isolator to transfer signals should be minimized to reduce cost of the digital isolator. Also, a digital isolator adds jitter to the sampling clock of an ADC, which increases sampling noise. Further, there is a propagation delay associated with signals crossing the digital isolator. This can limit the maximum interface clock frequency of the DAQ system.

Figure 4:
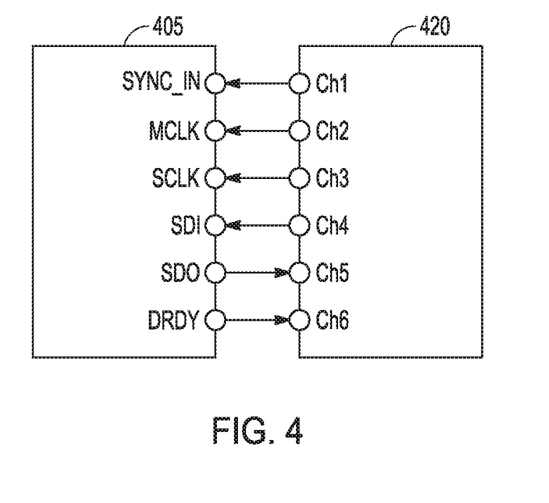
FIG. 4 is a block diagram of an example of an interface between a digital isolator and a sigma-delta.

FIG. 4 is a block diagram of an example of an interface between a digital isolator 420 and a sigma-delta ADC 405. The example shows six channels across the digital isolator 420. Channels 1-4 may transfer signals originating from a host device, and channels 5-6 may provide signals from the sigma-delta ADC 405 to the host device.

The SYNC_IN channel is an input receiving a device sampling synchronization input signal sent across the digital isolator to the ADC. It is used to synchronize the sampling across multiple oversampled ADCs sharing the same master clock. The MCLK channel is the ADC master clock sent across the digital isolator 420. It is used for generating the ADC sampling clock and the onboard digital clock of the ADC system. The SCLK channel is a serial interface clock. The SDI channel is a serial data input to the ADC. It may be used by a host device to send configuration data to the ADC system. The SDO channel is the serial data output to provide the conversion data. Conversion data is sent from the SDO output to the host device across the digital isolator. DRDY is an output sent from the ADC circuits across the digital isolator to indicate when conversion data is ready.

An issue with the scheme in FIG. 4 is that higher frequency input signals need a higher sample rate and therefore a higher frequency MCLK. This can cause digital isolator additive jitter to the MCLK which can negatively impact the signal-to-noise ratio (SNR) of the sigma-delta ADC 405.

Figure 5:
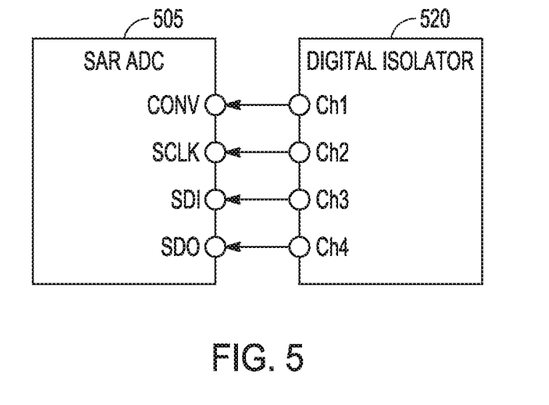
FIG. 5 is a block diagram of an example of an interface between a digital isolator and an SAR ADC circuit.

FIG. 5 is a block diagram of an example of an interface between a digital isolator 520 and an SAR ADC circuit 505. The interface includes the serial clock (SCLK), the serial data in (SDI), and the serial data out (SDO) signals as in the sigma-delta DC example. The interface also includes a conversion start (CONV) signal sent from a host device to trigger an ADC conversion by the SAR ADC circuit 505. Like the example of FIG. 4, the interface scheme in FIG. 5 is also susceptible to digital isolator additive jitter negatively impacting the SNR of the SAR ADC circuit 505.

Figure 6:
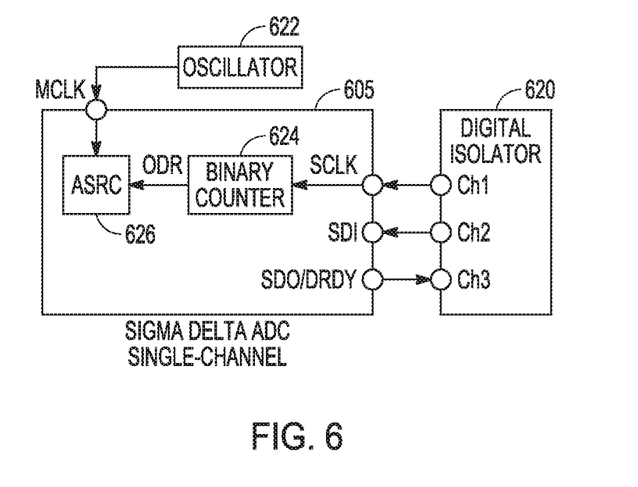
FIG. 6 is a block diagram of another example of an interface between a digital isolator and a sigma-delta ADC circuit.

FIG. 6 is a block diagram of an example of an interface between a digital isolator 620 and a sigma-delta ADC circuit 605. The example in FIG. 6 is an improvement over the example of FIG. 4 because the number of channels is reduced from six to three: SCLK, SDI, and SDO/DRDY. Part of the reduction in channels is not sending MCLK across the digital isolator 620. Instead, MCLK is generated on the ADC side of the digital isolator 620 using oscillator 622. This makes MCLK unconnected from the digital isolator 620 and asynchronous from SCLK. This makes MCLK not subject to additive jitter on SCLK from the digital isolator 620.

The number of channels is also reduced by combining SDO with DRDY. DRDY may be indicated on the SDO/DRDY by a leading transition or leading code followed by the serial conversion data. This reduces the two SDO and DRDY outputs in the example of FIG. 4 to one output channel. The sigma-delta ADC circuit 605 also includes logic circuitry such as a counter circuit 624 that generates an output data rate (ODR) signal from the serial clock (SCLK). The ADC samples the input signal based on a sample clock derived from MCLK. An asynchronous sample rate converter (ASRC) circuit 626 converts the ADC sample rate to the output data rate (ODR). This allows MLCK to be decoupled from ODR/SCLK. In some examples, the ASRC includes a phase lock loop (PLL) to reject jitter caused by sending SCLK across the digital isolator 620. The ODR signal can be adjusted through adjustment of the SLCK frequency.

Figure 7:
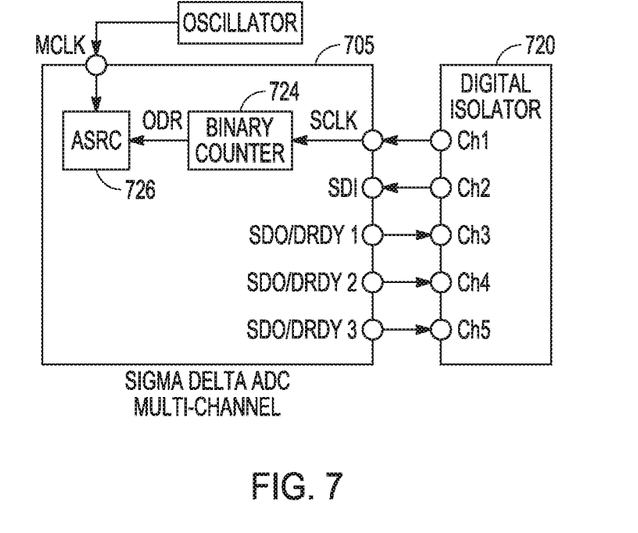
FIG. 7 is an example interface for a multi-channel sigma-delta ADC and a digital isolator circuit.

FIG. 6 shows an example of an interface for a single channel sigma-delta ADC. The technique in the example of FIG. 6 can be scaled for a multiple channel sigma-delta ADC. FIG. 7 is an example interface for a three channel sigma-delta ADC 705 and a digital isolator circuit 720. Each channel includes a quantizer circuit to generate conversion data and an SDO/DRDY output that provides the conversion data to the digital isolator 720. The ASRC circuit 726 generates an ADC sampling clock used by each of the channels to sample a signal for conversion. In some examples, each channel includes its own counter circuit 724 and ASRC circuit 726 to generate its own ADC sampling clock for the channel.

Figure 8:
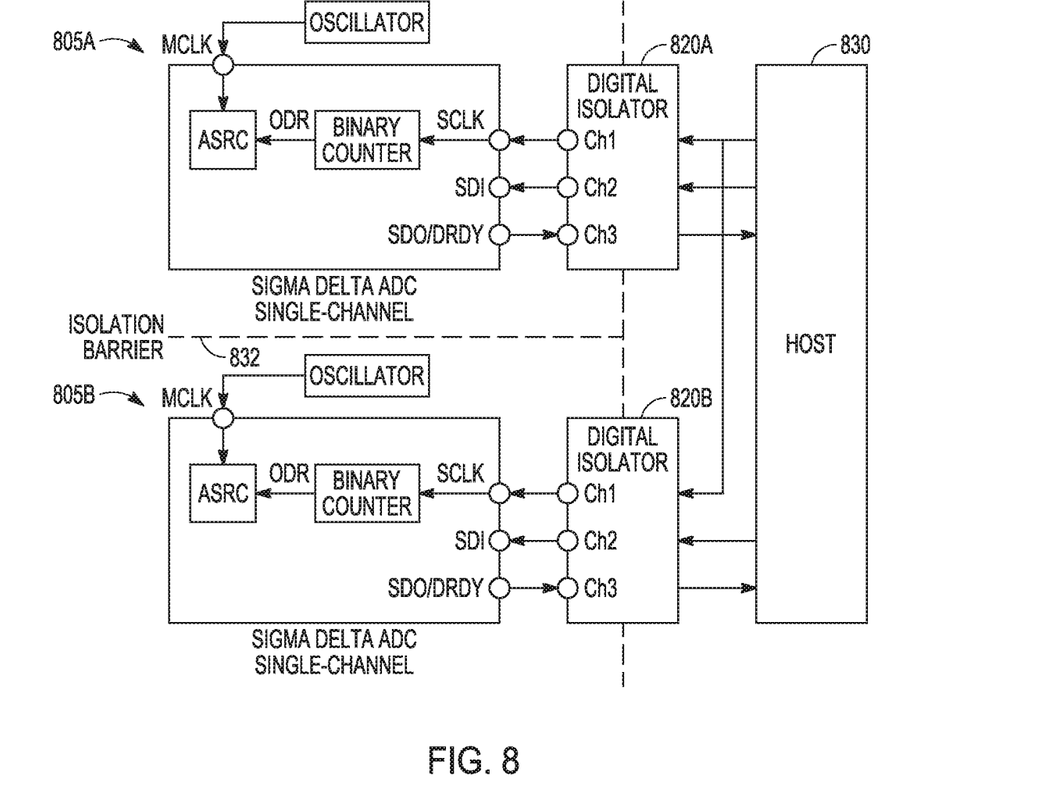
FIG. 8 is a block diagram of an example interface between a host device and multiple single-channel sigma-delta ADC circuits.

FIG. 8 is a block diagram of an example interface between a host device 830 and multiple single-channel sigma-delta ADC circuits 805A, 805B. Only two single-channel sigma-delta ADC circuits are shown to simplify the Figure and an actual implementation may include several single-channel sigma-delta ADC circuits. Each sigma-delta ADC circuit communicates with the host device 830 by sending signals across a digital isolator circuit 820A, 820B and the interface between each sigma-delta ADC circuit and digital isolator circuit is similar to the technique in the example of FIG. 6. Each interface can be a three wire full duplex interface that includes SCLK, SDI, and SDO/DRDY.

Each sigma-delta ADC circuit includes an MCLK input to receive a master clock signal from an oscillator that is not connected to a digital isolator circuit. The system in FIG. 8 includes an isolation barrier 832 separating the sigma-delta ADC circuits 805A, 805B. The isolation barrier 832 electrically isolates the sigma-delta ADC circuits. The isolation barrier 832 may allow for a separate power domain to each sigma-delta ADC circuits, and each sigma-delta ADC circuit may have a different common mode voltage separated by the isolation barrier. The isolation barrier also reduces noise at one sigma-delta ADC circuit due to the oscillator of the other sigma-delta ADC circuits.

The sigma-delta ADC circuits each include logic circuitry (e.g., a counter circuit) to generate an ODR signal from the SCLK signal. The logic circuitry may also synchronize the ODR signals of the multiple sigma-delta ADC circuits. The synchronization may result in response to a code received via the SDI input of the sigma-delta ADC circuits. The code may be sent by the host device 830 as part of configuration data.

Figure 9:
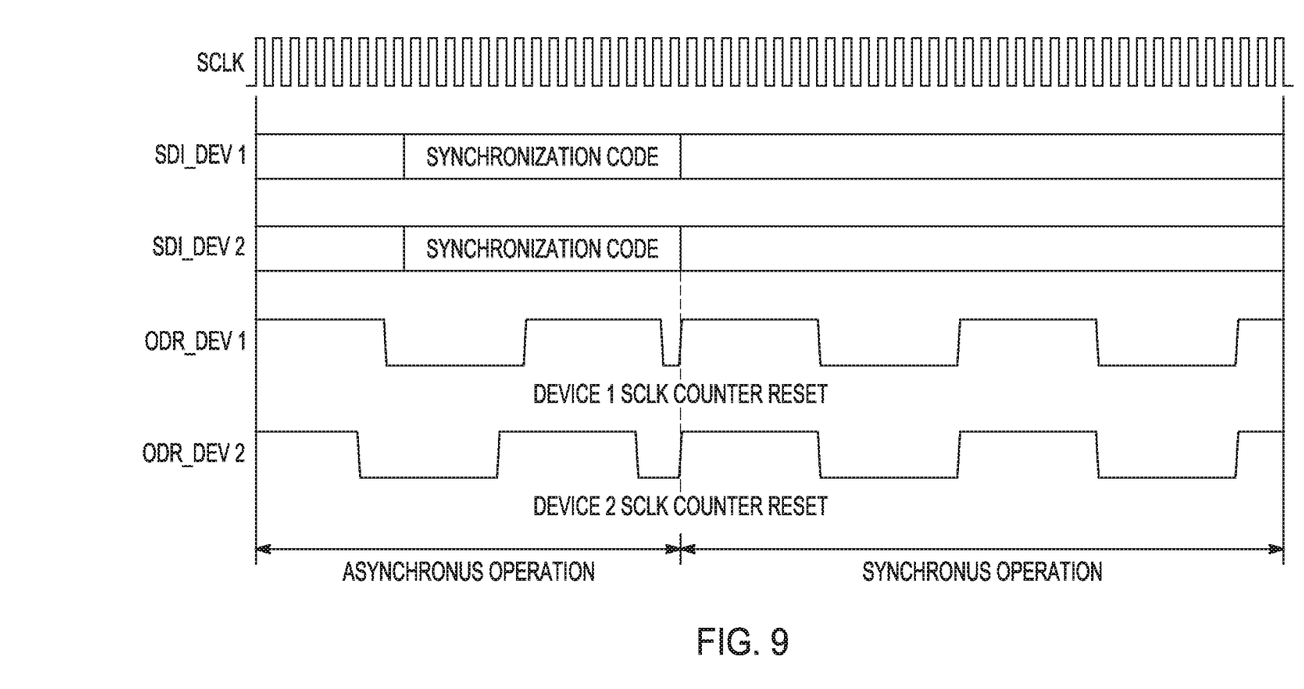
FIG. 9 is a timing diagram of an example of multi-ADC synchronization using the SDI input of the sigma-delta ADCs.

FIG. 9 is a timing diagram of an example of multi-ADC synchronization using the SDI input of the sigma-delta ADCs. Each sigma-delta ADC circuit receives the SCLK signal from the host device. Each sigma-delta ADC circuit generates an ODR signal from the SCLLK signal. The example of FIG. 9 illustrates that the ODR signals may not be synchronized initially and the sigma-delta ADC circuits are running in asynchronous operation. This may be due to differences in startup times or delay in signals between sigma-delta ADC circuits. The host device sends a synchronization code to the sigma-delta ADC circuits. In response to the code, the sigma-delta ADC circuits synchronize to the next SCLK signal transition and the sigma-delta ADC circuits then operate synchronously. The SCLK may be a gated clock and does not need to be continuous. This allows for control of the ODR signals of the multiple sigma-delta ADC circuits by starting and stopping the generation of the ODR signals.

Figure 10:
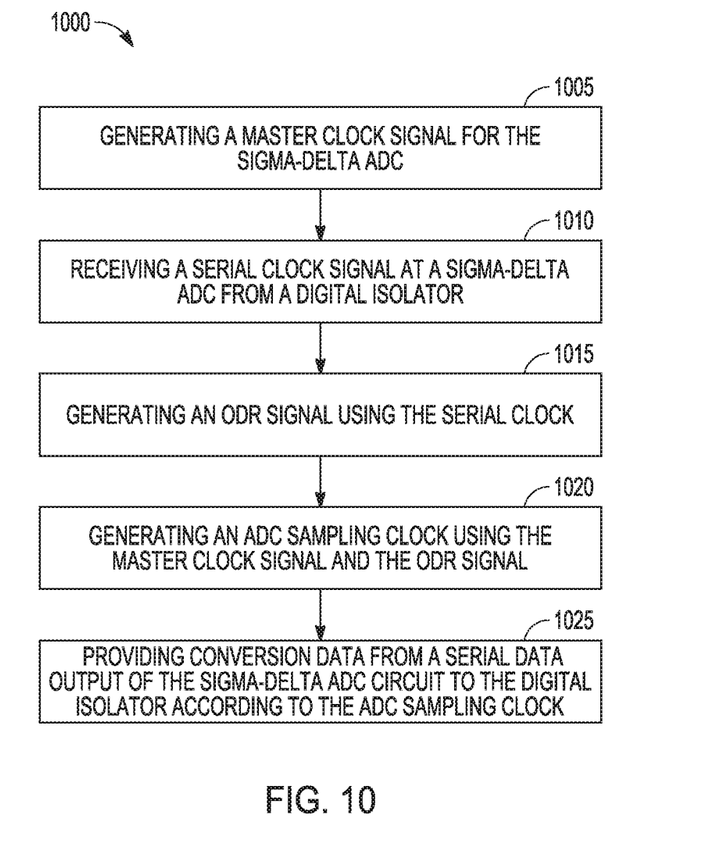
FIG. 10 is a flow diagram of an example of a method of controlling operation of a sigma-delta ADC circuit

FIG. 10 is a flow diagram of an example of a method 1000 of controlling operation of a sigma-delta ADC circuit. The method can also be used to control operation of an SAR ADC in an oversampling configuration. At 1005, a master clock signal for the ADC (sigma delta ADC or oversampled SAR ADC) is generated for the ADC. The master clock signal may be generated using an oscillator circuit local to the ADC.

At 1010, the ADC circuit receives a serial clock signal from a digital isolator circuit. The serial clock signal may be sent from a host device operatively coupled to the digital isolator circuit. The master clock signal is asynchronous to the serial clock signal and is generated independently of any signal provided by the digital isolator.

At 1015, an ODR signal is generated using the serial clock signal. The ODR signal may have a clock period that is a multiple of the serial clock signal rate and may be generated using a counter circuit. At 1020, an ADC sampling clock or ADC sample control signal is generated using the master clock signal, the sample rate is converted to the ODR (e.g., using an ASRC). At 1025, conversion data is provided serially from the ADC to the digital isolator from a serial data output of the ADC.

Figure 11:
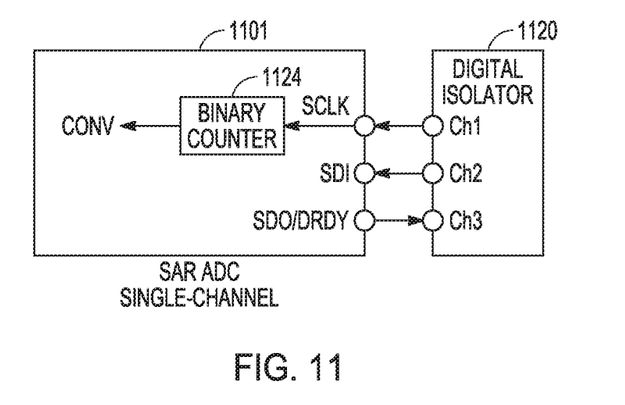
FIG. 11 is a block diagram of an example of an interface between a digital isolator and an SAR ADC circuit.

FIG. 11 is a block diagram of an example of an interface between a digital isolator 1120 and an SAR ADC circuit 1101. The interface is similar to the example of FIG. 6 in that the interface is a three-wire full duplex serial interface and includes a SDI input, an SCLK input, and a SDO/DRDY output. The SAR ADC circuit 1101 also includes logic circuitry (e.g., counter circuit 1124) configured to generate a conversion start (CONV) signal using the serial clock signal received from an output of the digital isolator circuit. In this way, a conversion start signal does not have to be sent across the digital isolator 1120.

The SCLK signal can be a gated clock signal and does not need to be continuous. This may allow the user to use an arbitrary pulse to control the CONV timing. For example, a user could design or program logic to generate the CONV signal on a count of 17. The first 16 clocks of the serial clock circuit could clock out 16 bits of data. The serial clock signal may then be stopped. Restarting the serial clock signal would generate the 17 count and generate a CONV signal for the next conversion.

Figure 12:
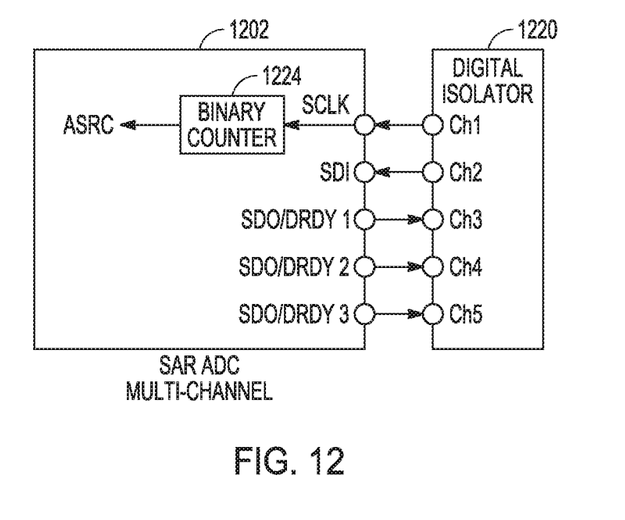
FIG. 12 is an example interface for a multi-channel SAR ADC and a digital isolator circuit.

The example in FIG. 11 shows an example of an interface for a single channel SAR ADC. The technique in the example of FIG. 11 can be scaled for a multiple channel SAR ADC. FIG. 12 is an example interface for a three channel SAR ADC 1202 and a digital isolator circuit 1220. Each channel includes a SAR ADC circuit to generate conversion data and an SDO/DRDY output that provides the conversion data to the digital isolator 1220. The multi-channel SAR ADC includes logic circuitry (e.g., counter circuit 1224) to generate a CONV signal used by all of the channels to start an analog-to-digital (A/D) conversion. In some examples, each channel includes its own logic circuitry to generate its own CONV signal for the channel, and the channels may begin a conversion at different times.

Figure 13:
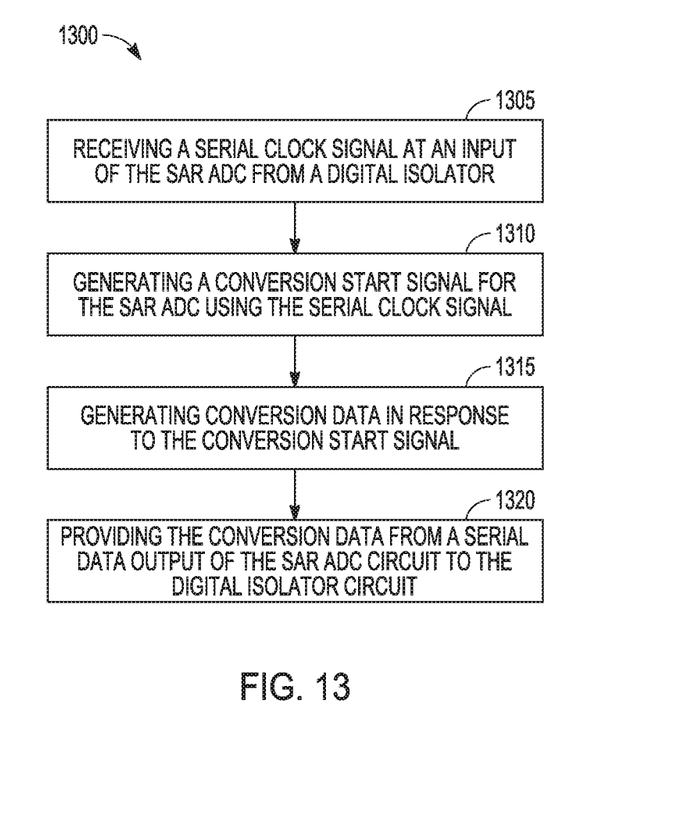
FIG. 13 is a flow diagram of an example of a method of controlling operation of an SAR ADC circuit.

FIG. 13 is a flow diagram of an example of a method 1300 of controlling operation of an SAR ADC circuit. At 1305, the SAR ADC circuit receives a serial clock signal from a digital isolator circuit. The serial clock signal may be sent from a host device operatively coupled to the digital isolator circuit.

At 1310, a conversion start signal is generated for the SAR ADC, and at 1315 conversion data is generated by the SAR ADC in response to the conversion start signal. Thus, a channel is not needed in the digital isolator for a separate conversion start signal to control the SAR ADC. At 1320, the conversion data is sent to the digital isolator circuit from a serial data output of the SAR ADC circuit. The serial clock may be used for both data conversion and clocking out the data.

The devices, systems and methods described herein provide a reduced wire interface between digital isolation and ADC circuits. This reduces the cost associated with the digital isolator circuits and improves the SNR of the interfaces at input signals having a higher frequency and needing a higher sampling rate.

Additional Description and Aspects

A first Aspect (Aspect 1) can include subject matter (such as an apparatus for data acquisition) comprising a sigma-delta analog-to-digital converter (ADC) circuit including a serial data input, a serial data output, a serial clock input to receive a serial clock signal, and a master clock input to receive a master clock signal; a digital isolator circuit including outputs coupled to the serial clock input and serial data input of the sigma-delta ADC circuit, and an input coupled to the serial data output of the sigma-delta ADC circuit; an oscillator circuit unconnected to the digital isolator circuit and configured to generate the master clock signal asynchronous to the serial clock input signal; and wherein the sigma-delta ADC circuit generates an ADC sampling clock using the master clock.

In Aspect 2, the subject matter of Aspect 1 optionally includes counter circuit configured to generate an output data rate signal using the serial clock signal received from an output of the digital isolator circuit; and an asynchronous sample rate converter circuit configured to generate the ADC sampling clock using the master clock signal and the output data rate signal.

In Aspect 3, the subject matter of Aspect 2 optionally includes a sigma-delta ADC circuit configured to provide a conversion data ready signal to the digital isolator circuit on the serial data output of the sigma-delta ADC circuit.

In Aspect 4, the subject matter of one or both of Aspects 2 and 3 optionally include a sigma-delta ADC circuit that is a multi-channel sigma-delta ADC circuit, and each channel of the multi-channel sigma-delta ADC circuit includes: a quantizer circuit; and a serial data output coupled to the digital isolator. Each channel of the multi-channel sigma-delta ADC circuit uses the ADC sampling clock generated using the master clock signal and the output data rate signal.

In Aspect 5, the subject matter of one or both of Aspects 2 and 3 optionally includes a sigma-delta ADC circuit that is a multi-channel sigma-delta ADC circuit. Each channel of the multi-channel sigma-delta ADC circuit includes: a quantizer circuit; a counter circuit configured to generate an output data rate signal for the channel using the serial clock signal; and an asynchronous sample rate converter circuit configured to generate a ADC sampling clock for the channel using the master clock signal and the output data rate signal generated for the channel.

In Aspect 6, the subject matter of one or any combination of Aspects 1-5 optionally includes multiple single-channel sigma-delta ADC circuits, each sigma-delta ADC circuit including a serial clock input to receive a serial clock signal, a master clock input to receive a master clock signal, a serial data in input, and a serial data output; multiple digital isolator circuits, wherein each digital isolator circuit includes outputs coupled to the serial clock input and serial data input of a sigma-delta ADC circuit, and an input coupled to the serial data output of the sigma-delta ADC circuit; multiple oscillator circuits, each oscillator circuit unconnected to a digital isolator circuit and configured to provide a master clock signal to a sigma-delta converter circuit; one or more isolation barriers isolating each sigma-delta ADC circuit its corresponding oscillator circuit from the other sigma-delta ADC circuits and oscillator circuits; and logic circuitry configured to synchronize the output data rate signals of the multiple sigma-delta converter circuits in response to a code received via the serial data input of the multiple sigma-delta converter circuits.

In Aspect 7, the subject matter of one or any combination of Aspects 1-6 optionally includes an interface between the sigma-delta ADC circuit and the digital isolator circuit is a three-wire full duplex serial interface.

Aspect 8 can include subject matter (such as a of controlling operation of an analog-to-digital converter (ADC)) or can optionally be combined with one or any combination of Aspects 1-7 to include such subject matter, comprising generating a master clock signal for the ADC; receiving a serial clock signal from a digital isolator, wherein the master clock signal is asynchronous to the serial clock signal and is generated independently of any signal provided by the digital isolator; generating an output data rate signal using the serial clock signal; generating an ADC sampling clock using the master clock signal and the output data rate signal; and providing conversion data from a serial data output of the ADC circuit to the digital isolator according to the ADC sampling clock.

In Aspect 9, the subject matter of Aspect 8 optionally includes providing a conversion data ready signal to the digital isolator circuit on the serial data output of the ADC circuit.

In Aspect 10, the subject matter of one or both of Aspects 8 and 9 optionally includes providing conversion data from multiple channels of the ADC to the digital isolator, wherein the conversion is provided using a serial data output of each channel according to the ADC sampling clock.

In Aspect 11, the subject matter of one or any combination of Aspects 8-10 optionally includes providing conversion data from multiple channels of the ADC to the digital isolator, wherein the conversion is provided using a serial data output of each channel according to an ADC sampling clock generated by each channel.

In Aspect 12, the subject matter of one or any combination of Aspects 8-11 optionally includes providing conversion data from multiple ADC circuits that are electrically isolated from each other to multiple digital isolators; receiving a serial clock signal from a digital isolator of multiple digital isolators and generating an output data rate signal using the received serial clock signal; synchronizing the generated output data rate signals; generating a master clock signal that is asynchronous to the received serial clock signal; and each ADC circuit generating an ADC sampling clock using the master clock and the synchronized output data rate signals.

In Aspect 13, the subject matter of Aspect 12 optionally includes synchronizing the output data rate signals of the multiple ADC circuits in response to a code received via the serial data input of the multiple ADC circuits; and transferring the serial clock signal, the code, and the conversion data between each ADC circuit and a corresponding digital isolator using a three-wire interface of between each ADC circuit and the corresponding digital isolator.

Aspect 14 can include subject matter (such as an apparatus for data acquisition), or can optionally be combined with one or any combination of Aspects 1-13 to include such subject matter, comprising a successive approximation register analog-to-digital converter (SAR ADC) circuit including a serial data input, and a serial data output, and a serial clock input to receive a serial clock signal; a digital isolator circuit including outputs coupled to the serial data in input, the serial data output, and the serial clock input of the SAR ADC circuit; and wherein the SAR ADC further includes logic circuitry configured to generate a conversion start signal using the serial clock signal received from an output of the digital isolator circuit.

In Aspect 15, the subject matter of Aspect 14 optionally includes an SAR ADC circuit that is a multi-channel SAR ADC circuit, and wherein each channel of the multi-channel SAR ADC circuit generates conversion data according to the same conversion start signal and includes a serial data output coupled to the digital isolator to provide the conversion data to the digital isolator circuit.

In Aspect 16, the subject matter of Aspect 14 optionally includes an SAR ADC circuit that is a multi-channel SAR ADC circuit. Each channel of the multi-channel SAR ADC circuit includes logic circuitry to generate a channel conversion start signal for the channel, and a serial data output coupled to the digital isolator to provide conversion data to the digital isolator circuit.

In Aspect 17, the subject matter of one or any combination of Aspects 14-16 optionally includes the received serial clock signal being a gated clock signal.

In Aspect 18, the subject matter of one or any combination of Aspects 14-17 optionally includes an interface between the SAR ADC and the digital isolator that is a three-wire full duplex serial interface.

Aspect 19 includes subject matter (such as a method of operating an SAR ADC circuit) or can optionally be combined with one or any combination of Aspects 1-18 to includes such subject matter, comprising receiving a serial clock signal from an output of a digital isolator circuit at an input of the SAR ADC circuit; generating a conversion start signal using the serial clock signal; generating conversion data in response to the conversion start signal; and providing the conversion data from a serial data output of the SAR ADC circuit to the digital isolator circuit.

In Aspect 20, the subject matter of Aspect 19 optionally includes generating multiple channels of conversion data using a multi-channel SAR ADC in response to the conversion start signal, and providing the conversion data includes providing conversion data from a serial data output of each channel to the digital isolator circuit.

In Aspect 21, the subject matter of Aspect 19 optionally includes generating conversion data includes generating multiple channels of conversion data using a multi-channel SAR ADC in response to a conversion start signal generated by each channel using the serial clock signal, and providing conversion data from a serial data output of each channel to the digital isolator circuit.

In Aspect 22, the subject matter of one or any combination of Aspects 19-21 optionally includes transferring the serial clock signal, serial output data, and serial input data between the SAR ADC circuit and the digital isolator circuit using a three-wire full duplex serial interface.

These non-limiting Aspects can be combined in any permutation of combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus for data acquisition, the apparatus comprising:
    a sigma-delta analog-to-digital converter (ADC) circuit including a serial data input, a serial data output, a serial clock input to receive a serial clock signal, and a master clock input to receive a master clock signal;
    a digital isolator circuit including outputs coupled to the serial clock input and serial data input of the sigma-delta ADC circuit, and an input coupled to the serial data output of the sigma-delta ADC circuit;
    a counter circuit configured to generate an output data rate signal using the serial clock signal received from an output of the digital isolator circuit;
    an oscillator circuit unconnected to the digital isolator circuit and configured to generate the master clock signal asynchronous to the serial clock input signal; and
    an asynchronous sample rate converter circuit configured to generate an ADC sampling clock using the master clock signal and the output data rate signal.

2. The apparatus of claim 1, wherein the sigma-delta ADC circuit is configured to provide a conversion data ready signal to the digital isolator circuit on the serial data output of the sigma-delta ADC circuit.

3. The apparatus of claim 1, wherein the sigma-delta ADC circuit is a multi-channel sigma-delta ADC circuit, and each channel of the multi-channel sigma-delta ADC circuit includes:
   a quantizer circuit; and
   a serial data output coupled to the digital isolator; and
   wherein each channel of the multi-channel sigma-delta ADC circuit uses the ADC sampling clock generated using the master clock signal and the output data rate signal.

4. The apparatus of claim 1, wherein the sigma-delta ADC circuit is a multi-channel sigma-delta ADC circuit, and each channel of the multi-channel sigma-delta ADC circuit includes:
   a quantizer circuit;
   a counter circuit configured to generate an output data rate signal for the channel using the serial clock signal; and
   an asynchronous sample rate converter circuit configured to generate a ADC sampling clock for the channel using the master clock signal and the output data rate signal generated for the channel.

5. The apparatus of claim 1, including:
   multiple single-channel sigma-delta ADC circuits, each sigma-delta ADC circuit including a serial clock input to receive a serial clock signal, a master clock input to receive a master clock signal, a serial data in input, and a serial data output;
   multiple digital isolator circuits, wherein each digital isolator circuit includes outputs coupled to the serial clock input and serial data input of a sigma-delta ADC circuit, and an input coupled to the serial data output of the sigma-delta ADC circuit;
   multiple oscillator circuits, each oscillator circuit unconnected to a digital isolator circuit and configured to provide a master clock signal to a sigma-delta converter circuit;
   one or more isolation barriers isolating each sigma-delta ADC circuit its corresponding oscillator circuit from the other sigma-delta ADC circuits and oscillator circuits; and
   logic circuitry configured to synchronize the output data rate signals of the multiple sigma-delta converter circuits in response to a code received via the serial data input of the multiple sigma-delta converter circuits.

6. The apparatus of claim 1, wherein an interface between the sigma-delta ADC circuit and the digital isolator circuit is a three-wire full duplex serial interface.

7. A method of controlling operation of an analog-to-digital converter (ADC), the method comprising:
   generating a master clock signal for the ADC;
   receiving a serial clock signal from a digital isolator, wherein the master clock signal is asynchronous to the serial clock signal and is generated independently of any signal provided by the digital isolator;
   generating an output data rate signal using a counter circuit and the serial clock signal received from the output of the digital isolator;
   generating an ADC sampling clock using an asynchronous sample rate converter circuit, the master clock signal, and the output data rate signal; and
   providing conversion data from a serial data output of the ADC circuit to the digital isolator according to the ADC sampling clock.

8. The method of claim 7, including providing a conversion data ready signal to the digital isolator circuit on the serial data output of the ADC circuit.

9. The method of claim 7, wherein providing the conversion data includes providing conversion data from multiple channels of the ADC to the digital isolator, wherein the conversion is provided using a serial data output of each channel according to the ADC sampling clock.

10. The method of claim 7, wherein providing the conversion data includes providing conversion data from multiple channels of the ADC to the digital isolator, wherein the conversion is provided using a serial data output of each channel according to an ADC sampling clock generated by each channel.

11. The method of claim 7,
    wherein providing conversion data includes providing conversion data from multiple ADC circuits that are electrically isolated from each other to multiple digital isolators;
    wherein receiving a serial clock signal includes each ADC circuit receiving a serial clock signal from a digital isolator of multiple digital isolators and generating an output data rate signal using the received serial clock signal;
    wherein the method further includes synchronizing the generated output data rate signals;
    wherein generating a master clock signal includes each ADC circuit generating a master clock signal that is asynchronous to the received serial clock signal; and
    wherein generating an ADC sampling clock includes each ADC circuit generating an ADC sampling clock using the master clock and the synchronized output data rate signals.

12. The method of claim 11, wherein synchronizing the output data rate signals includes:
    synchronizing the output data rate signals of the multiple ADC circuits in response to a code received via the serial data input of the multiple ADC circuits; and
    transferring the serial clock signal, the code, and the conversion data between each ADC circuit and a corresponding digital isolator using a three-wire interface of between each ADC circuit and the corresponding digital isolator.

13. An apparatus for data acquisition, the apparatus comprising:
    a multi-channel successive approximation register analog-to-digital converter (SAR ADC) circuit including a serial data input and a serial clock input to receive a serial clock signal, wherein each channel includes an SAR ADC circuit and a serial data output;
    a digital isolator circuit including outputs coupled to the serial data in input, the serial data outputs of each of the channel SAR ADC circuits, and the serial clock input of the multi-channel SAR ADC circuit; and
    wherein the multi-channel SAR ADC circuit further includes at least one gated counter circuit configured to generate a conversion start signal using the serial clock signal received from an output of the digital isolator circuit.

14. The apparatus of claim 13, wherein each channel of the multi-channel SAR ADC circuit generates conversion data according to the same conversion start signal.

15. The apparatus of claim 13, wherein each channel of the multi-channel SAR ADC circuit includes
    logic circuitry configured to generate a channel conversion start signal for the channel.

16. The apparatus of claim 13, wherein the serial clock signal is a gated clock signal.

17. The apparatus of claim 13, wherein an interface between the SAR ADC and the digital isolator is a three-wire full duplex serial interface.

18. A method of operating a multi-channel successive approximation register analog-to-digital converter (SAR ADC) circuit, each channel of the multi-channel SAR ADC circuit including an SAR ADC circuit and a serial data output, the method comprising:
   receiving a serial clock signal from an output of a digital isolator circuit at an input of the multi-channel SAR ADC circuit;
   generating a conversion start signal using the serial clock signal received from the output of the digital isolator circuit and a gated counter circuit of the multi-channel SAR ADC circuit;
   generating multiple channels of conversion data using the channel SAR ADC circuits of the multi-channel SAR ADC circuit in response to the conversion start signal; and
   providing the conversion data from the serial data outputs of the channel SAR ADC circuits to the digital isolator circuit.

19. The method of claim 18,
   wherein generating conversion data includes generating the multiple channels of conversion data in response to the same conversion start signal.

20. The method of claim 18,
   wherein generating conversion data includes generating the multiple channels of conversion data in response to a conversion start signal generated by each channel using the serial clock signal.

21. The method of claim 18, including transferring the serial clock signal, serial output data, and serial input data between the multi-channel SAR ADC circuit and the digital isolator circuit using a 2+N wire full duplex serial interface, wherein N is the number of channels of the multi-channel SAR ADC circuit.

* * * * *

UNITED STATES PATENT AND TRADEMARK OFFICE
CERTIFICATE OF CORRECTION

PATENT NO.       : 11,206,040 B2                                Page 1 of 1
APPLICATION NO.  : 16/867094
DATED            : December 21, 2021
INVENTOR(S)      : Ren et al.

It is certified that error appears in the above-identified patent and that said Letters Patent is hereby corrected as shown below:

On the Title Page

On page 2, in Column 2, item (56) under "Other Publications", Line 4, delete "Lovy" and insert --Low-- therefor Signed and Sealed this
Twenty-second Day of February, 2022

Drew Hirshfeld
*Performing the Functions and Duties of the
Under Secretary of Commerce for Intellectual Property and
Director of the United States Patent and Trademark Office*